(12) United States Patent
Xu (10) Patent No.: US 6,768,435 B2
(45) Date of Patent: Jul. 27, 2004

(54) BANDPASS SIGMA-DELTA MODULATOR (75) Inventor: Yong-Ping Xu, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 10/188,071

(22) Filed: Jul. 3, 2002

(65) Prior Publication Data
US 2003/0090399 A1 May 15, 2003

Related U.S. Application Data
(60) Provisional application No. 60/331,256, filed on Nov. 13, 2001.

(51) Int. Cl.⁷ .......................... H03M 3/00; H04B 14/06
(52) U.S. Cl. ...................................... 341/143; 375/247
(58) Field of Search ................................ 341/143, 144, 341/118, 120, 155; 375/247; 318/594

(56) References Cited
U.S. PATENT DOCUMENTS 5,392,039 A * 2/1995 Thurston ..................... 341/143
6,281,652 B1 * 8/2001 Ryan et al. .................. 318/594
6,346,898 B1 * 2/2002 Melanson .................... 341/143
6,362,764 B1 * 3/2002 Niimi et al. ................. 341/144
6,414,615 B1 * 7/2002 Cheng ......................... 341/143
6,462,687 B1 * 10/2002 Eshraghi et al. ............. 341/143
6,473,011 B1 * 10/2002 Steensgaard-Madsen .... 341/118

* cited by examiner

Primary Examiner—Patrick Wamsley
(74) Attorney, Agent, or Firm—Birch, Stewart, Kolasch & Birch, LLP (57) ABSTRACT

A bandpass sigma-delta modulator using acoustic resonators or micro-mechanical resonators. In order to improve resolution at high frequencies, acoustic resonators or micro-mechanical resonators are utilized in a sigma-delta modulator instead of electronic resonators. The quantized output is fed back using a pair of D/A converters to an input summation device. In fourth order devices, the feed back is to two summation devices in series. Such a sigma-delta modulator is usable in a software defined radio cellular telephone system and in other applications where high-frequency and high-resolution A/D conversion is required.

4 Claims, 7 Drawing Sheets

FIG.10

BANDPASS SIGMA-DELTA MODULATOR

This application claims priority on provisional Application No. 60/331,256 filed Nov. 13, 2001, the entire contents of which are hereby incorporated by reference.

FIELD OF THE INVENTION

The present invention relates generally to a bandpass sigma-delta modulator, and more particularly to a bandpass sigma-delta modulator using an acoustic resonator or micro-mechanical resonator.

DESCRIPTION OF THE BACKGROUND ART

Cellular telephone systems have become very popular in many countries throughout the world. Unfortunately, the specific standards adopted by different countries are often different and cellular devices from one country will not be operable within another system. Accordingly, completely different handsets are necessary if a person is operating in two different countries having different standards.

As a result of this difficulty, there have been some efforts to provide a single device that is operable in different countries having different standards. A technology known as software-defined radio (SDR) provides one solution to this problem. In the SDR system, the entire band of RF or IF signal is digitized and the channel is selected using a programmable digital filter. Thus, the SDR can be reconfigured through the software to suit different standards. However, this effort has not been completely successful because it requires a high-speed A/D converter that must have not only high-speed, but also provide adequate resolution. In the ideal SDR arrangement, the RF is directly digitized in the receiver. It requires that the A/D converter have a speed in the gigahertz range, and also have a dynamic range over a 100 dB, which is equivalent to a 16-bit resolution. Among the various A/D converters, the sigma-delta A/D converter has promise in achieving the desired dynamic range. However, it is only achievable at a much lower frequency band. As the frequency increases, circuit imperfections become dominant and degrade the dynamic range of the A/D converter. At the gigahertz sampling frequency range, the highest dynamic range for the reported bandpass sigma-delta modulator is 75 dB, which only corresponds to a 12.5 bit resolution.

Figure 1:
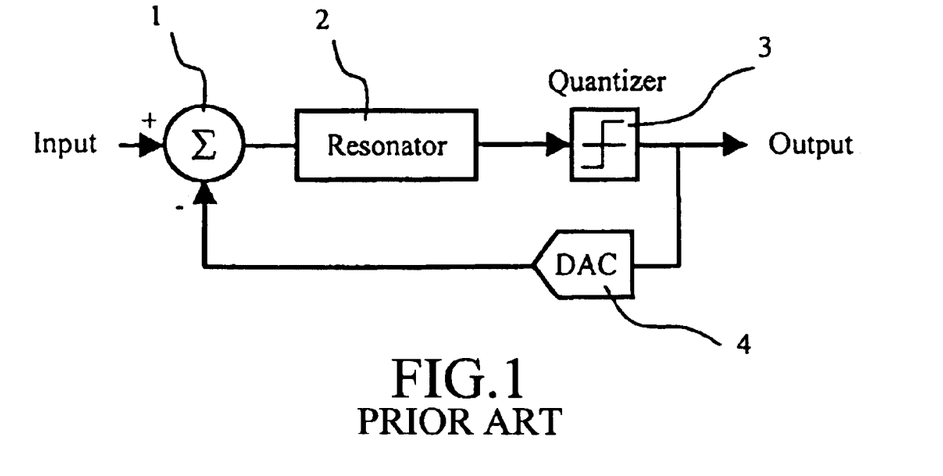
FIG. 1 is a block diagram of a prior art bandpass sigma-delta modulator.

A sigma-delta A/D converter consists of a sigma-delta modulator and a digital filter. FIG. 1 shows a typical arrangement of a bandpass sigma-delta modulator. The key element in the modulator is the resonator 2 which provides the quantization noise shaping. That is, the resonator acts as a bandpass filter in a band around its resonance frequency. The resonator needs to operate at a high frequency and have a high Q (quality factor) value. The output of the resonator is passed to a quantizer 3 which produces a digital "1" signal if its input exceeds a threshold and a digital "0" signal if the input is less than the threshold. This digital signal of a series of 0's and 1's becomes the output of the sigma-delta modulator. These signals are also fed back to a D/A converter 4, and the resultant analog signal is applied as a second input to summation device 1 which also receives the input to the modulator. The difference between the input and the feedback of the summation device produces an input to the resonator.

Figure 2:
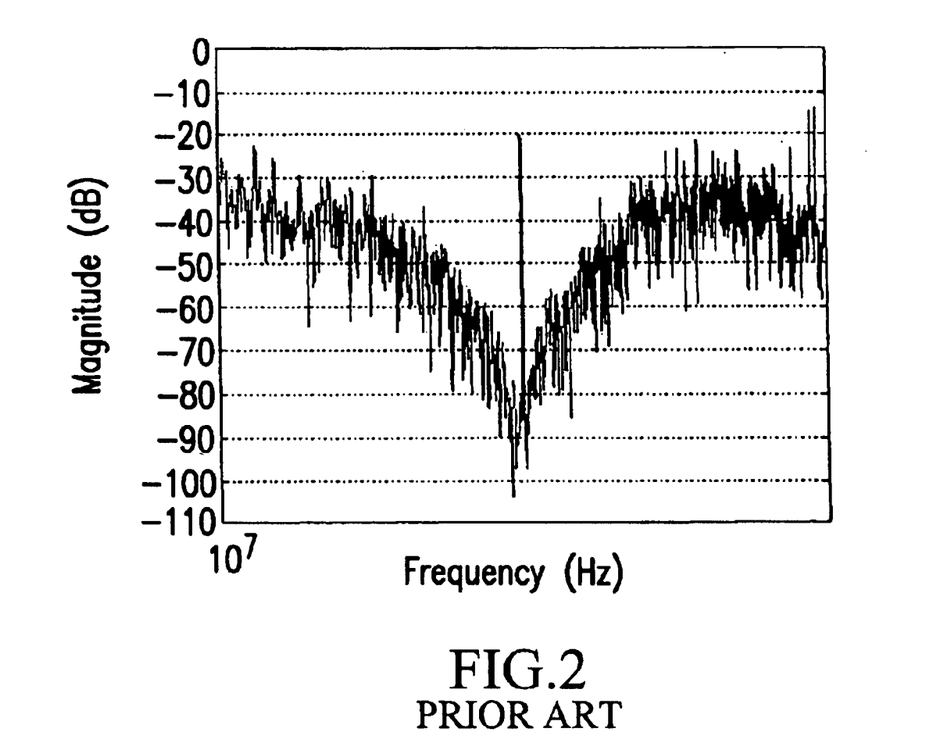
FIG. 2 is a graph of the output spectrum from a typical fourth order modulator.

FIG. 2 shows a typical output spectrum from a fourth order bandpass sigma-delta modulator where the quantization noise is shaped away from the resonance frequency, resulting in a very high dynamic range. The depth of the notch is related to the Q value of the resonator. The higher the Q value is, the deeper the notch. The noise shaping is also dependent on the order of the modulator. Higher order modulators provide better noise shaping and hence a higher dynamic range.

Typically, the resonator is made of one of three different electronic circuits, namely, a passive L-C tank, a transconductor-capacitor or a switch-capacitor. However, none of these circuits have been successful in the situation described. The first two circuits cannot achieve a high Q value due to parasitic losses and non-linearity. Typical Q values are around 10 and 40 for the integrated L-C tank with and without Q enhancement, respectively. The enhanced Q value for the transconductor-capacitor resonator can be up to 300 at a frequency of several hundred MHz. The switch-capacitor resonator is restricted by its low resonant frequency (<100 MHz) due to the slow settling behavior of the circuit. The use of these types of resonators prevents the sigma-delta modulator from achieving a high speed and high dynamic range at the same time as is required in an SDR situation. In order to achieve a workable SDR system, it is necessary to find a resonator which is usable in a sigma-delta modulator to achieve high speed and high dynamic range.

SUMMARY OF THE INVENTION

Accordingly, one object of this invention is to provide a bandpass sigma-delta modulator having high-speed and high-dynamic range.

Another object of the invention is to provide a bandpass sigma-delta modulator using a micro-mechanical resonator.

Another object of the invention is to provide a bandpass sigma-delta modulator utilizing an acoustic resonator.

A further object of this invention is to provide a second order bandpass sigma-delta modulator having two D/A converters.

A still further object of this invention is to provide a fourth order sigma-delta modulator having two D/A converters and two summation devices.

A still further object of this invention is to provide a sigma-delta A/D converter including a sigma-delta modulator having a resonator of the micro-mechanical or acoustical type.

Briefly, these and other objects of the invention are achieved by using either a micro-mechanical resonator or an acoustical resonator as a bandpass filter which provides an output to a quantizer. The output of the quantizer acts as the output of the modulator and is also fed back to two different D/A converters. The output of the two converters is adjusted by a gain and applied to a summation device, along with the input. The output of the summation device is applied as an input to the resonator. In the fourth order device, two resonators are used along with a second summation device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 3:
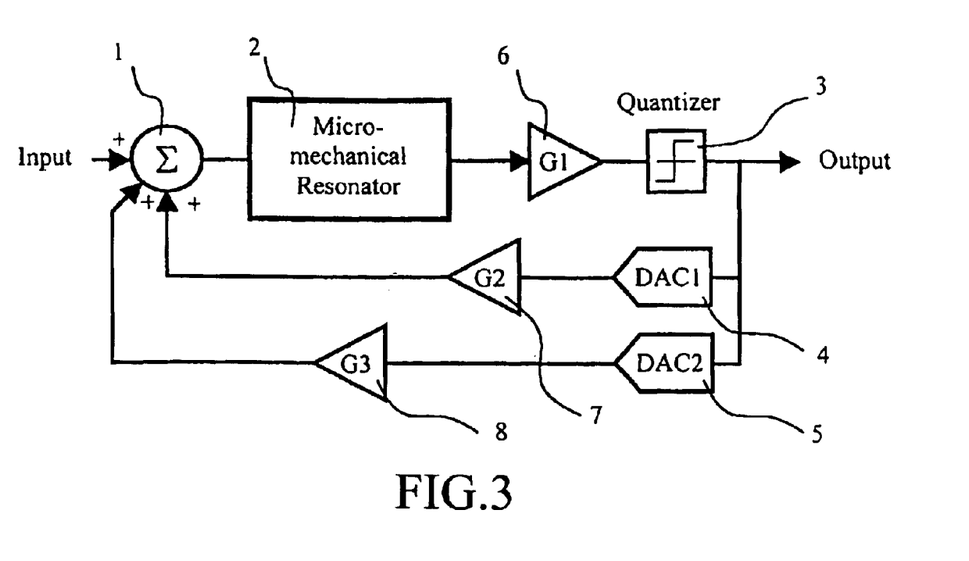
FIG. 3 is a block diagram of a second order bandpass sigma-delta modulator using a micro-mechanical resonator according to the present invention.

Referring now to the drawings, wherein like reference numerals designate identical corresponding parts throughout the several views, and more particularly to FIG. 3 which shows a second order sigma-delta modulator using a micro-mechanical resonator. The summing circuit 1 adds the analog input to two outputs from two gain stages. The sum forming the output of the summing circuit becomes the input to the micro-mechanical resonator 2. The resonator selectively passes the signal at its resonance frequency and attenuates signals at other frequencies. The output from the resonator is adjusted by gain stage G1, 6 and fed to quantizer 3. The signal is quantized to form a series of binary bits as in FIG. 1 which form the output of the modulator. The output is also fed back as an input to a pair of D/A converters, DAC1, 4, and DAC2, 5. The converters are both one bit converters but have different output pulses. One is a return to zero converter, whereas the other is a half return to zero converter. As a result, they have different transfer functions in the frequency domain. The output of the converters are analog signals which are fed back to the summing circuit through gain stages G2, 7 and G3, 8. The value of the gains in G1–G3 may be either positive or negative and often the gains in the feedback path are negative so that the feedback is subtracted from the input signal in a similar fashion to FIG. 1.

Figure 4:
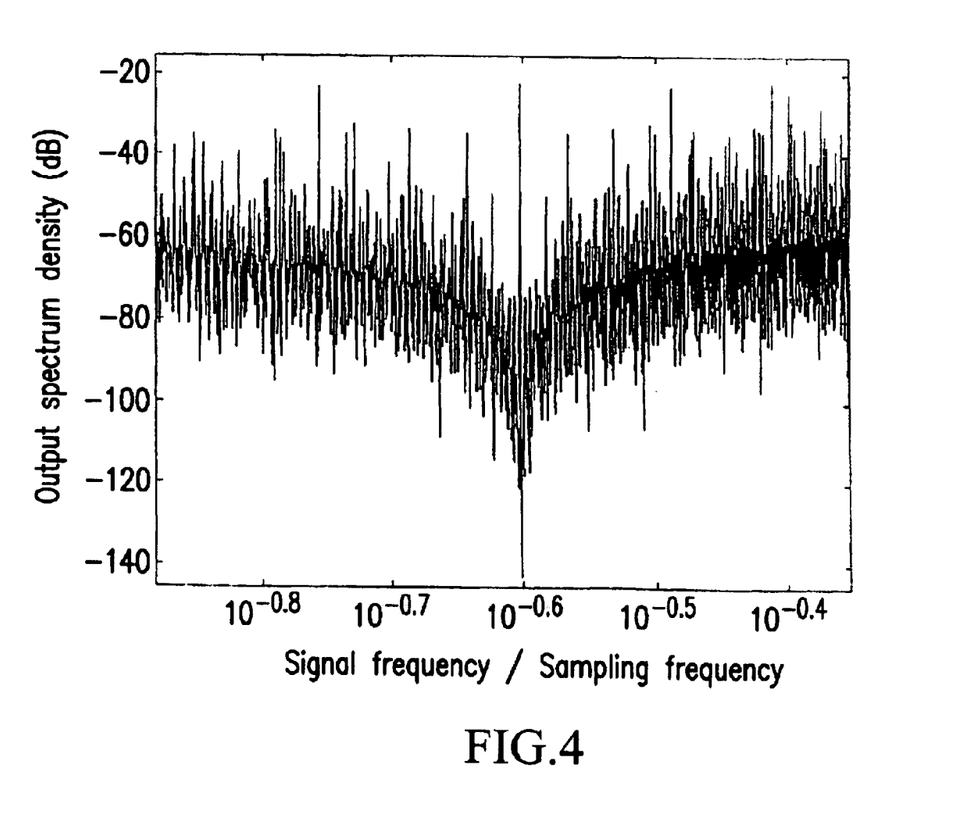
FIG. 4 is a graph of the output spectrum from the second order bandpass sigma-delta modulator of FIG. 3.

Since the micro-mechanical resonator 2 is a second order system, the bandpass modulator shown in FIG. 3 is of the second order, and provides second order noise-shaping as shown in FIG. 4. This modulator based on the micro-mechanical resonator is capable of digitizing the analog input signal, but with a limited resolution. Better resolution can be obtained using a fourth order modulator as will be described below. However, since the Q values of the micro-mechanical resonator can easily be greater than 1000 and even as high as 10,000, it is possible to have a high resonance frequency, up to a gigahertz using this type of resonator. Accordingly, the use of this different resonator allows the modulator to operate at the gigahertz sampling frequency range with good resolution.

Figure 5:
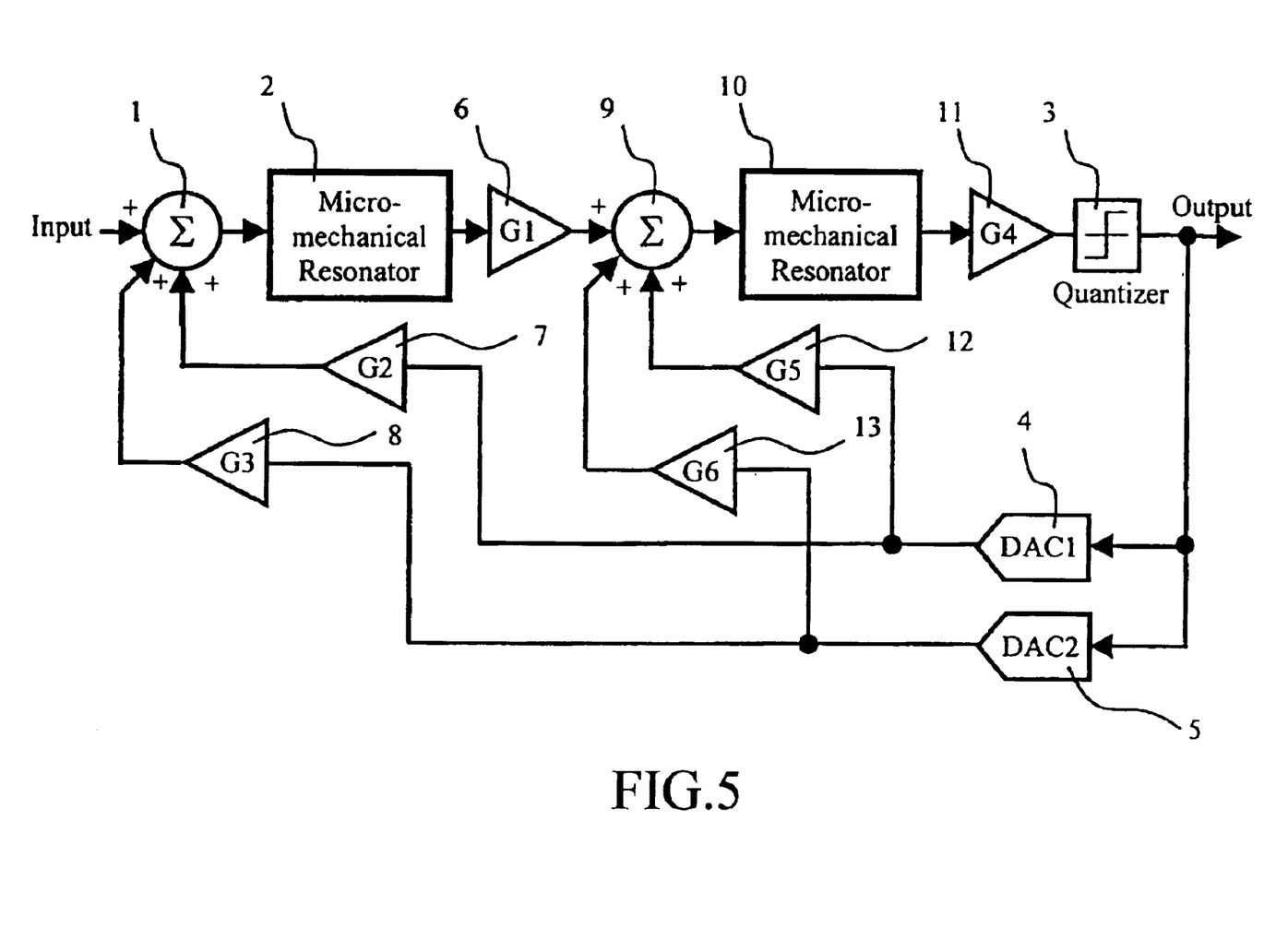
FIG. 5 block diagram of a fourth order bandpass sigma-delta modulator using micro-mechanical resonators.

FIG. 5 illustrates a corresponding fourth order bandpass sigma-delta modulator using a micro-mechanical resonator. Input summing circuit 1 adds the input to the modulator and the feedback from 2 gain stages in a similar fashion to FIG. 3. The output of the summing circuit is fed to micro-mechanical resonator 2 which produces an output to gain stage G1, 6. This output is then applied to the second summing circuit 9 along with two additional feedback signals. The sum of these signals is used as the input to the second micro-mechanical resonator 10 which also selectively passes the signal at the resonance frequency and attenuates the signal at other frequencies. This output is adjusted by gain stage G4, 11 and its output is applied to quantizer 3. The output of the quantizer is a series of digital bits as described above and forms the output of the modulator. This output is fed back to two converters D/A converters 4 and 5 in a similar fashion to FIG. 3. However, in addition to the analog feedback signal being applied to gain stages G2 and G3 as in FIG. 3, they are also applied to gain stages G5, 12, and G6, 13 as inputs to the second summing circuit 9.

Figure 6:
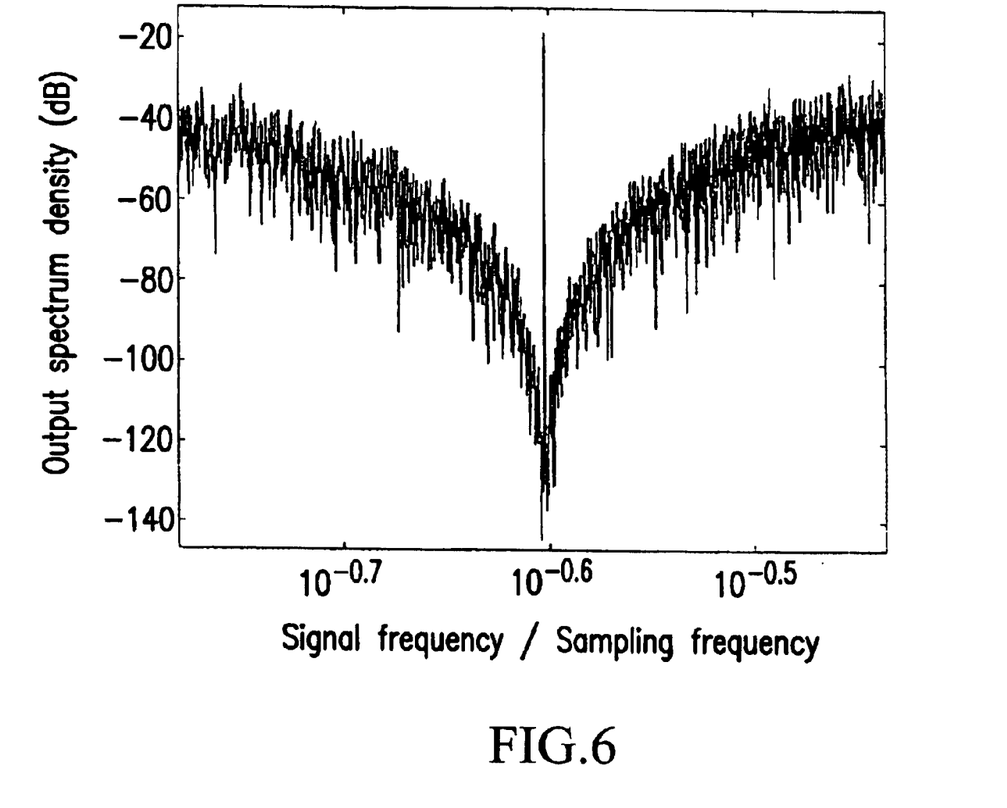
FIG. 6 is a graph of the output spectrum from a fourth order bandpass sigma-delta modulator according to FIG. 5.

The output is the output of a fourth order bandpass sigma-delta modulator having a digitized form of the input analog signal. By having two micro-mechanical resonators in the loop, this device provides fourth order noise-shaping as shown in FIG. 6. This fourth order modulator using two micro-mechanical resonators is able to provide digitization of the analog signal with high resolution.

As in the embodiment of FIG. 3, the gain stages can be either positive or negative, and either gain or attenuation, as necessary.

Another type of resonator which has superior performance to electronic resonators are acoustic resonators. A surface acoustic wave (SAW) resonator has a resonance frequency of 50–2,000 MHz. It also has a Q factor of 4,000–15,000. A film bulk acoustic resonator (FBAR) has a resonance frequency of 300–10,000 MHz and a Q factor of 100 to 1000. The use of these types of resonators in the bandpass sigma-delta modulator also produces a digital output with high resolution at high frequencies.

Figure 7:
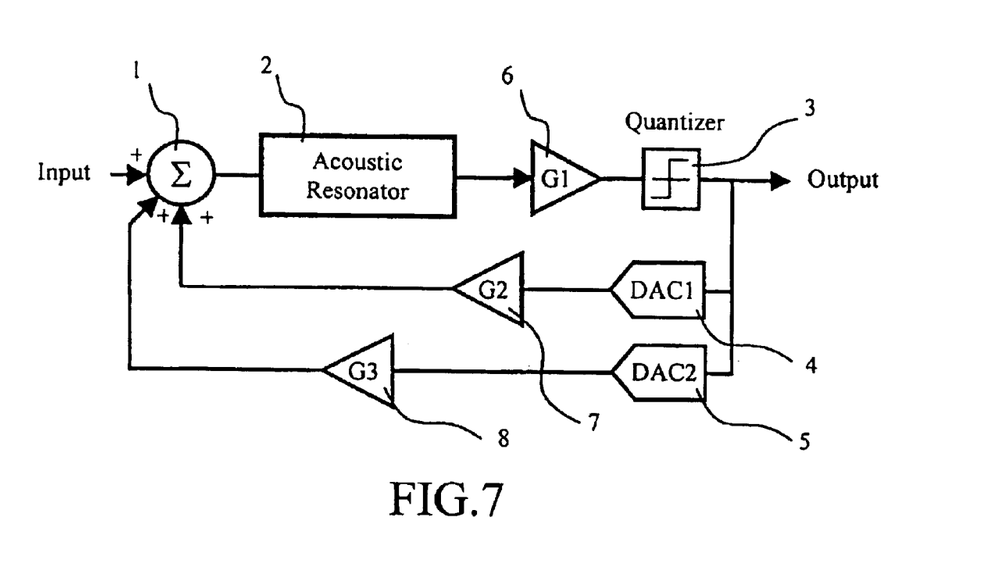
FIG. 7 is a block diagram of the second order bandpass sigma-delta modulator using an acoustical resonator.
Figure 8:
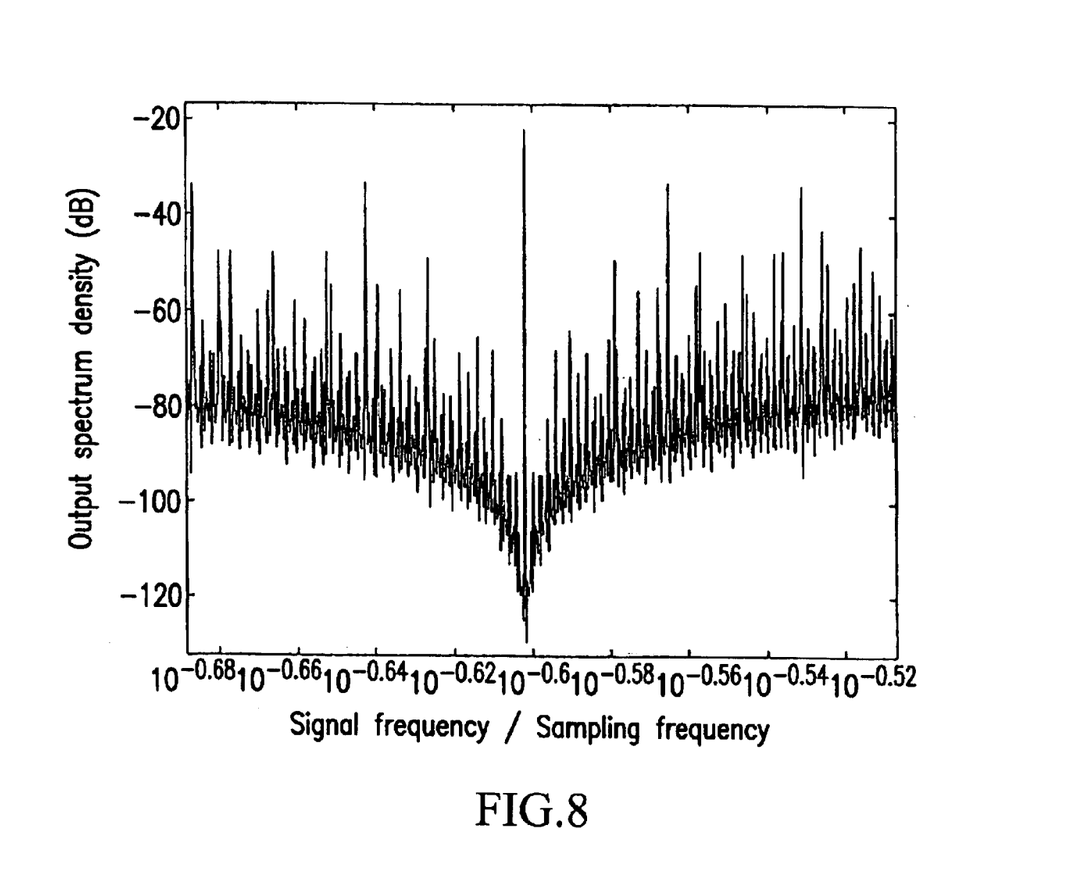
FIG. 8 is a graph of the output spectrum from a second order bandpass sigma-delta modulator shown in FIG. 7.

FIG. 7 shows a bandpass sigma-delta modulator using an acoustic resonator 2. The remaining parts of the circuit operate in a similar fashion to that of FIG. 3. Since the acoustic resonator 2 is a second order system, the bandpass sigma-delta modulator shown in FIG. 7 is of second order and provides second order noise-shaping as shown in FIG. 8. This modulator using an acoustic resonator is capable of digitizing the analog input signal, but with less resolution than a fourth order modulator.

Figure 9:
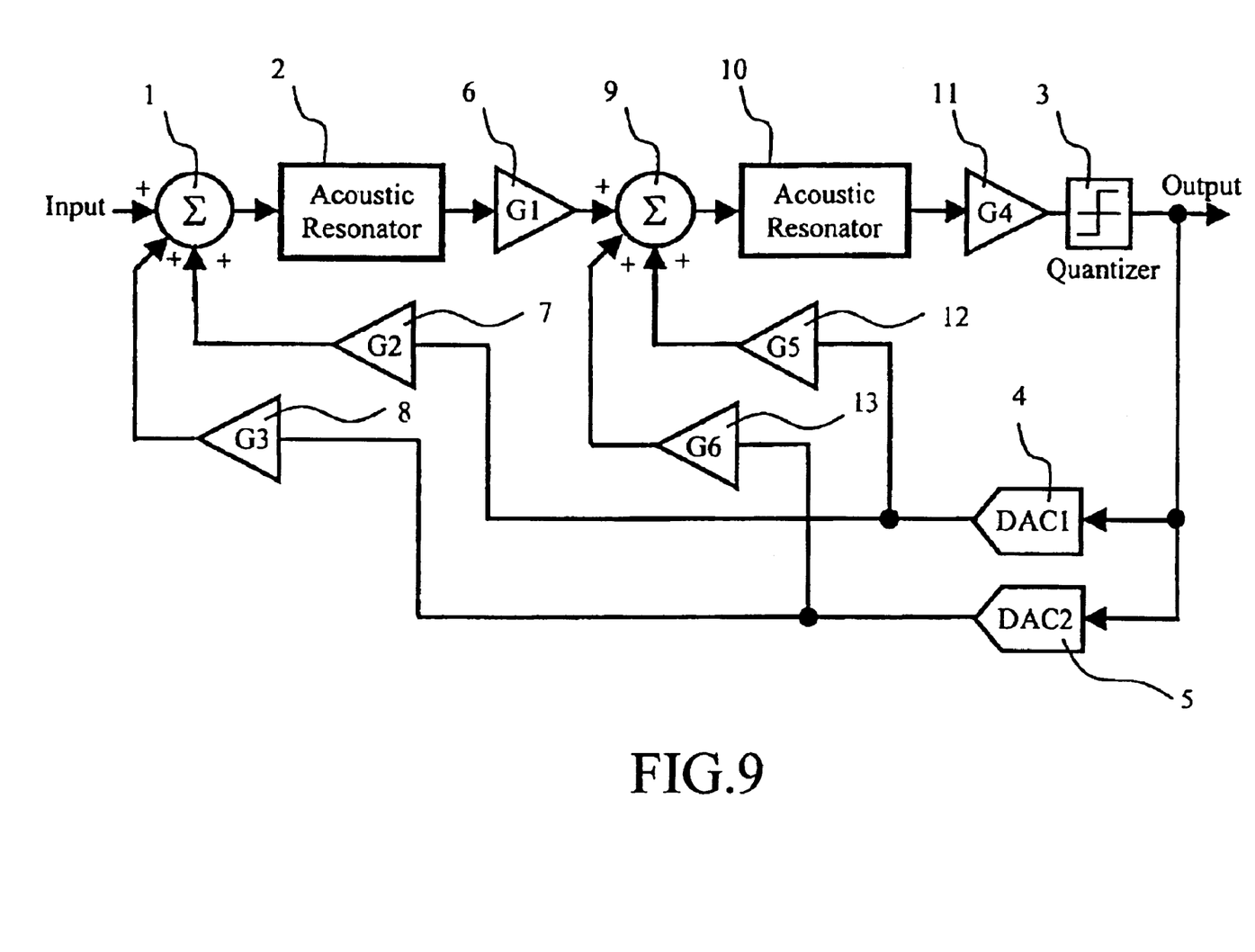
FIG. 9 is a block diagram of a fourth order bandpass sigma-delta modulator using acoustical resonators.
Figure 10:
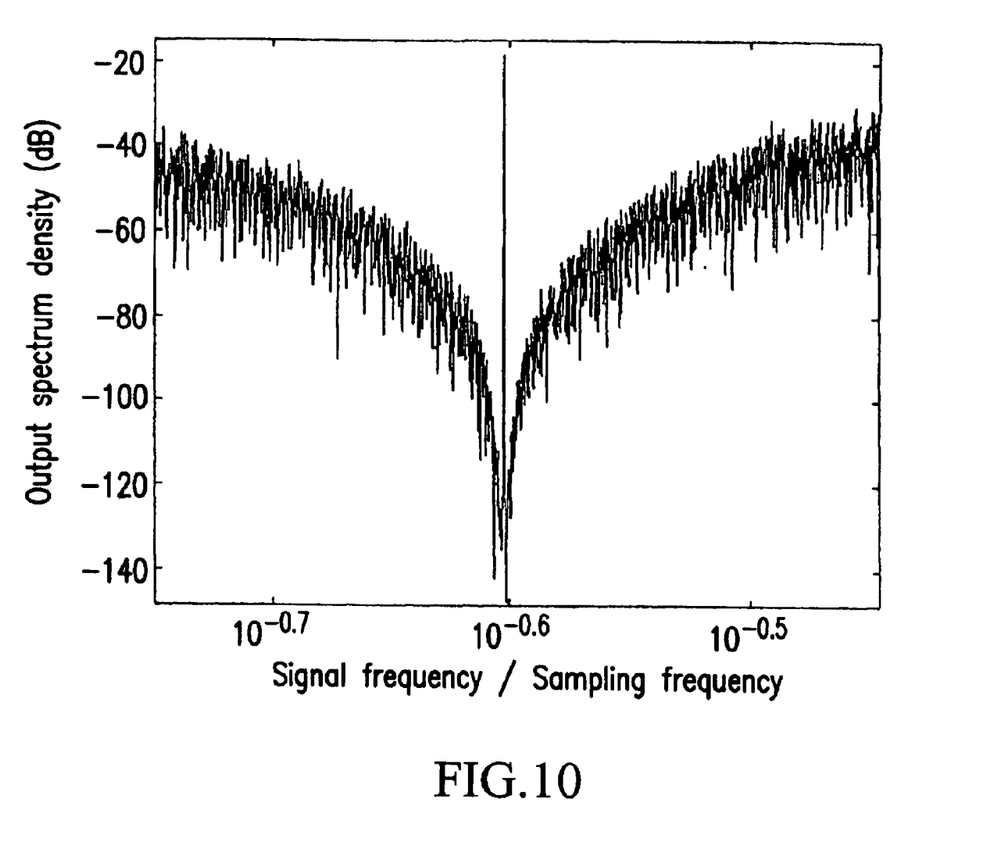
FIG. 10 is a graph showing the output spectrum from a fourth order bandpass sigma-delta modulator as shown in FIG. 9.

FIG. 9 shows such a fourth order bandpass sigma-delta modulator using acoustic resonators. This arrangement is similar to that shown in FIG. 5, but uses acoustic resonators rather than micro-mechanical resonators. Since there are two acoustic resonators in the loop, the modulator provides a fourth order noise shaping as shown in FIG. 10 and is therefore of fourth order. This fourth order bandpass sigma-delta modulator using acoustic resonators is able to provide the digitization of the analog signal with a high resolution at high frequency.

Numerous additional modifications and variations of the present invention are possible in light of the above teachings. It is therefore to be understood that within the scope of the appended claims, the invention may be practiced otherwise than as specifically described herein.

What is claimed is:

1. A bandpass sigma-delta modulator comprising:
   a summing device for receiving an input and first and second feedback signals and producing an output;
   a micro-mechanical resonator receiving the output of said summing circuit as an input and producing an output;
   a quantizer receiving the output of said micro-mechanical resonator and producing a digital output which is the output of said modulator and;
   first and second D/A converters receiving said output of said quantizer as an input and producing said first and second feedback signals.

2. The bandpass sigma-delta modulator according to claim 1, wherein gain stages are provided between said first D/A converter and said summing device, between said second D/A converter and said summing device, and between said micro-mechanical resonator and said quantizer.

3. A bandpass sigma-delta modulator comprising:
- a first summing device receiving an input, a first feedback signal and a second feedback signal and producing an output;
- a first micro-mechanical resonator receiving said output from said first summing device and producing an output;
- a second summing device receiving said output from said first micro-mechanical resonator and receiving third and fourth feedback signals and producing an output;
- a second micro-mechanical resonator receiving said output from said second summing circuit and producing an output;
- a quantizer receiving said output from said second micro-mechanical resonator and producing an output which is the output of said modulator; and
- first and second D/A converters, each receiving the output of said quantizer as an input, said first D/A converter producing said first and third feedback signals, and said second D/A converter producing said second and fourth feedback signals.

4. The bandpass sigma-delta modulator according to claim 3, further comprising gain stages between said first micro-mechanical resonator and said second summing device, between said second micro-mechanical resonator and said quantizer, between said first D/A converter and said first summing device, between said first D/A converter and said second summing device, between said second D/A converter and said first summing device and between said second D/A converter and said second summing device.

* * * * *